United States Patent [19]

Mittel et al.

[11] Patent Number: 5,610,558
[45] Date of Patent: Mar. 11, 1997

[54] CONTROLLED TRACKING OF OSCILLATORS IN A CIRCUIT WITH MULTIPLE FREQUENCY SENSITIVE ELEMENTS

[75] Inventors: James G. Mittel; Philip L. Johnson, both of Lake Worth; Raymond L. Barrett, Jr., Ft. Lauderdale, all of Fla.

[73] Assignee: Motorola, Inc., Schaumburg, Ill.

[21] Appl. No.: 552,136

[22] Filed: Nov. 3, 1995

[51] Int. Cl.$^6$ ................................. H03L 7/07; H03L 7/16
[52] U.S. Cl. ................ 331/2; 331/16; 331/173; 327/147; 455/26
[58] Field of Search ................................. 331/2, 16, 17, 331/18, 173; 327/147–150, 156–159; 360/51; 455/260

[56] References Cited

U.S. PATENT DOCUMENTS

| 4,859,970 | 8/1989 | Matsuo et al. | 331/57 |
|---|---|---|---|
| 5,075,639 | 12/1991 | Taya | 331/2 |
| 5,231,390 | 7/1993 | Mittel | 340/825.44 |
| 5,329,251 | 7/1994 | Llewelyn | 331/2 |
| 5,414,390 | 5/1995 | Kovacs et al. | 331/2 |

*Primary Examiner*—David Mis
*Attorney, Agent, or Firm*—D. Andrew Floam

[57] ABSTRACT

An oscillator circuit (143) comprises a master phase-locked loop (PLL) circuit (202) that receives as input a first reference frequency signal (136) and generates a first clock signal (210) in response to an oscillator control signal (212). The oscillator circuit (143) includes a frequency sensitive slave circuit (206) having at least one frequency sensitive element (322) that is responsive to a tracking control signal (214) to generate a second clock signal (216). A tracking control circuit (204) is responsive to the oscillator control signal (212) for generating the tracking control signal (214). The tracking control signal (214) serves as a bias signal, and is connected to the frequency sensitive slave circuit (206) for achieving a fast power up sequence of the oscillator circuit (143).

9 Claims, 4 Drawing Sheets

CONTROLLED TRACKING OF OSCILLATORS IN A CIRCUIT WITH MULTIPLE FREQUENCY SENSITIVE ELEMENTS

FIELD OF THE INVENTION

This invention relates in general to phase-locked loops, and more specifically to an apparatus that controls tracking of oscillators in a circuit with multiple frequency sensitive elements.

BACKGROUND OF THE INVENTION

Classical frequency synthesizers, which can be programmed to two or more frequencies, inherently have noisy, frequency-unstable warm-up times during the reprogramming process. The same is true during initial power-up of the frequency synthesizer. The warm-up time for a programmable frequency synthesizer is considered the time taken by the frequency synthesizer to switch from one operating frequency to a second operating frequency within a desired frequency lock range (e.g., ±10 Hz from the desired second operating frequency), or the time period needed to achieve a desired power-up frequency within a desired frequency lock range.

To achieve a fast warm-up time, classical frequency synthesizers are designed with complex filtering structures, and overcompensated voltage (or current) controlled oscillators (VCO). The filtering structures have the disadvantage of using specialized external components which are costly, and often adversely affect manufacturing quality of a product utilizing the frequency synthesizer. The VCOs are designed to cover a wide frequency spectrum in order to account for instability during the power up cycle of the phase-locked loop. This design approach leads to a complex oscillator which is expensive, and power inefficient.

Thus, what is needed is an apparatus that overcomes the aforementioned problems. Preferably, the apparatus should be low cost, power efficient, and provide a substantially faster warm-up time than prior art systems.

DETAILED DESCRIPTION OF THE DRAWINGS

Figure 1:
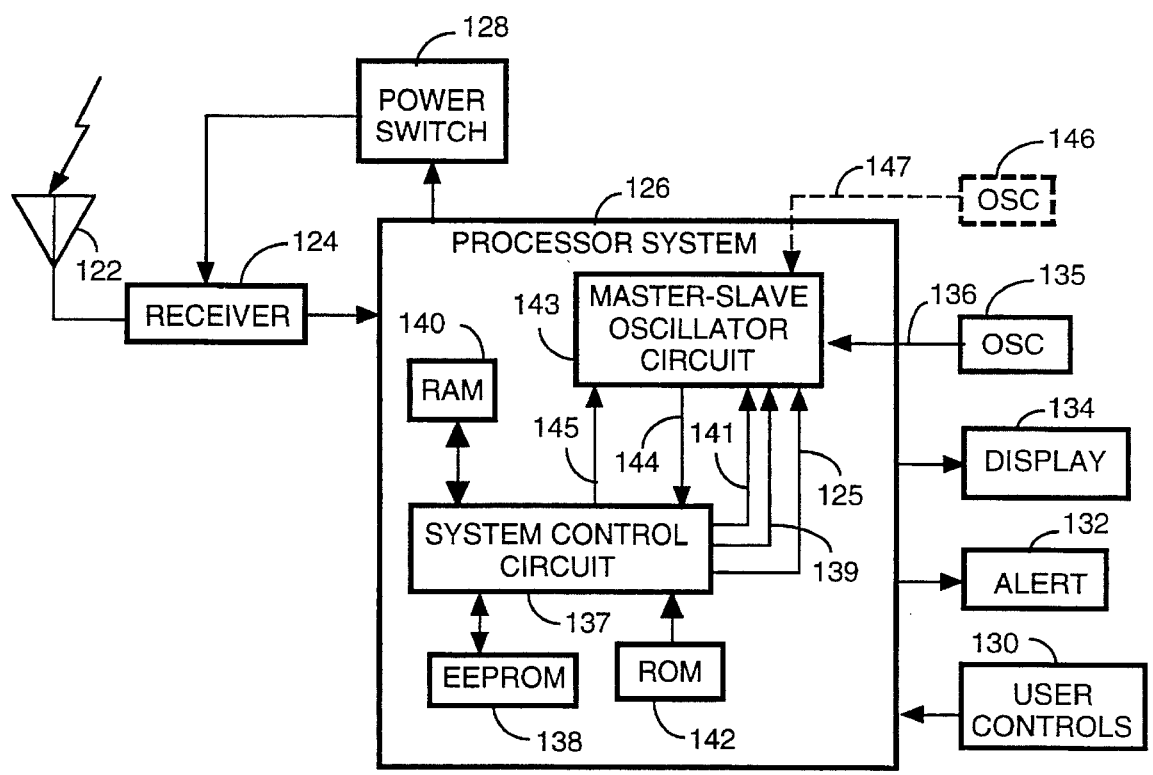
FIG. 1 is an electrical block diagram of a selective call receiver employing a master-slave oscillator circuit in accordance with the present invention.

FIG. 1 is an electrical block diagram of a selective call receiver 100 in accordance with the present invention. The selective call receiver 100 includes a receiver antenna 122 for intercepting radio frequency (RF) signals comprising messages from a transmitting station (not shown). The receiver antenna 122 is coupled to a receiver 124 that applies conventional demodulation techniques for receiving the RF signals. As a result of demodulating, the receiver 124 generates demodulated message information which is coupled to a processor system 126 for processing. A conventional power switch 128, coupled to the processor system 126, is used to control the supply of power to the receiver 124, thereby providing a battery saving function.

To perform the necessary functions of the selective call receiver 100, the processor system 126 includes a system control circuit 137 which is embodied by a microprocessor, a random access memory (RAM) 140, a read-only memory (ROM) 142, an electrically erasable programmable read-only memory (EEPROM) 138, and a master-slave oscillator circuit 143. It will be appreciated that, alternatively, the master-slave oscillator circuit 143 can be included in the receiver 124.

Preferably, the system control circuit 137 is a M68HC08 micro-controller manufactured by Motorola, Inc. It will be appreciated that other similar processors can be utilized for the system control circuit 137, and that additional processors of the same or alternative type can be added as required to handle the processing requirements of the processor system 126. It will also be appreciated that other types of memory, e.g., EEPROM or FLASH, are useful for the ROM 142, as well as the RAM 140. It will be further appreciated that the RAM 140 and the ROM 142, singly or in combination, are configured as an integral portion of the processor system 126.

The processor system 126 is programmed by way of the ROM 142 to process incoming messages transmitted by the transmitting station. During message processing, the processor system 126 decodes (in a conventional manner) an address in the demodulated message information, compares the decoded address with one or more addresses stored in the EEPROM 138, and when a match is detected, processes the remaining portion of the message.

Once the processor system 126 has processed the message, it stores the message in the RAM 140, and a call alerting signal is generated to alert a user that a message has been received. The call alerting signal is directed to a conventional audible or tactile alerting device 132 for generating an audible or tactile call alerting signal.

The message can be accessed by the user through user controls 130, which provide functions such as lock, unlock, delete, read, etc. More specifically, by the use of appropriate functions provided by the user controls 130, the message is recovered from the RAM 140, and then conveyed to the user by way of an information interface comprising a display 134 for displaying the message, e.g., a conventional liquid crystal display (LCD).

The system control circuit 137 is also coupled to the master-slave oscillator circuit 143, referred to herein as an oscillator circuit 143, providing the function of a phase-locked loop (PLL) for generating a microprocessor clock 144 coupled to the core circuitry of the system control circuit 137. The oscillator circuit 143 is also coupled to a time base reference oscillator 135 for generating a first reference signal 136. In an alternate embodiment, the oscillator circuit 143 is also coupled to a second time base reference oscillator 146 for generating a second reference signal 147.

The system control circuit 137 is also coupled to the oscillator circuit 143 by way of a control bus. The control bus includes an ON/OFF control signal 141, a clock control signal 139, a divide constant programming signal 145, and a tracking information signal 125.

Figure 2:
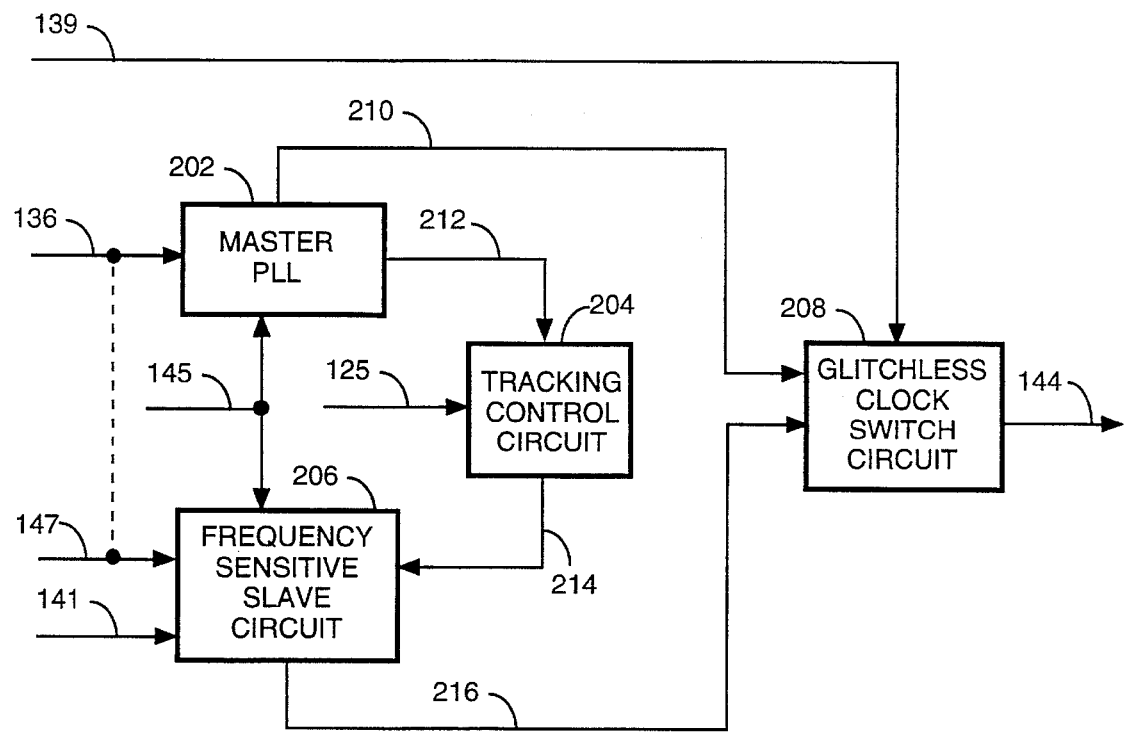
FIG. 2 is an electrical block diagram of the oscillator circuit in accordance with the present invention.

FIG. 2 is an electrical block diagram of the oscillator circuit 143 in accordance with the present invention. The oscillator circuit 143 comprises a master phase-locked loop (PLL) 202, a tracking control circuit 204, a frequency sensitive slave circuit 206 (referred to herein as the slave PLL 206), and a glitchless clock switch circuit 208. It will be appreciated that, alternatively, the slave PLL 206 is any type of frequency sensitive slave circuit, such as, for example, a conventional audio tone alert circuit.

The master PLL 202 receives as input the first reference frequency signal 136 and the divide constant programming signal 145, and generates a first clock signal 210 that is coupled to the input of the glitchless clock switch circuit 208. The master PLL 202 also generates an oscillator control signal 212 that is coupled to the input of the tracking control circuit 204. The tracking control circuit 204 also has an input for receiving the tracking information signal 125 generated by the system control circuit 137. The tracking control circuit 204 generates as output a tracking control signal 214 that is coupled to the input of the slave PLL 206.

The slave PLL 206 has three additional inputs that include the second reference frequency signal 147, the divide constant programming signal 145, and the ON/OFF control signal 141 sourced by the microprocessor control bus. The second reference frequency signal 147 is preferably derived from the first reference frequency signal 136 as a signal that is a frequency multiple of the first reference frequency signal 136. In an alternative embodiment as shown in FIG. 1, the second reference frequency signal 147 is generated from the second time base reference oscillator 146.

The slave PLL 206 generates as output a second clock signal 216. The second clock signal 216, and the first clock signal 210 generated by the master PLL 202 are coupled to the inputs of the glitchless clock switch circuit 208. The glitchless clock switch circuit 208 generates the microprocessor clock 144 that is used to operate the core circuitry of the system circuit 137. The microprocessor clock 144 signal is either the first dock signal 210, or the second clock signal 216, depending on control of the glitchless clock switch circuit 208 by the clock control signal 139.

The operation of the oscillator circuit 143 is as follows. The master PLL 202 phase locks the first clock signal 210 to the first reference frequency signal 136 so that the frequency of the tint clock signal 210 is the same as the frequency of the first reference frequency signal 136. The oscillator control signal 212, a current source signal, is derived from the internal circuits of the master PLL 202 (to be discussed hereafter), and is utilized by the tracking control circuit 204 as a reference signal.

In the generation of the tracking control signal 214, the tracking control circuit 204 is controlled by the system control circuit 137 (algorithmically, as will be described below) by way of the tracking information signal 125. The tracking information signal 125 comprises a tracking information bus that includes binary data sourced by the system control circuit 137. The binary data is used for the scaling the tracking control signal 214, that is also a current source signal. The binary data represents a multiplication factor of the oscillator control signal 212. For example, a factor of one on the tracking information bus results in the generation of a tracking control signal 214 that is substantially equal to the oscillator control signal 212, A factor of two leads to a tracking control signal 214 that is substantially equal to twice the signal magnitude of the oscillator control signal 212.

The tracking control signal 214 is used by the slave PLL 206 as a bias signal to derive a fast warm-up time during power-up. In normal operation, the slave PLL 206 is turned on and off periodically in order to save battery life. The turning on and off of the slave PLL 206 is controlled by the ON/OFF control signal 141 derived from the microprocessor control bus. The bias signal provides a reference signal to the oscillator circuit (not shown in FIG. 2) of the slave PLL 206 which allows for a quick coarse lock to the desired frequency of operation. Fine tuning of the desired frequency is further accomplished by the slave PLL 206, as will be described below.

Depending on the mode of operation of the oscillator circuit 143, the glitchless clock switch circuit 208 is programmed to select the first clock signal 210, or the second clock signal 216. When the selective call receiver 100 is in standby mode (i.e., the power switch 128 has the receiver 124 powered down), the glitchless clock switch circuit 208 is programmed to select the first clock signal 210 by way of the clock control signal 139. When the selective call receiver 100 is actively receiving messages, the glitchless clock switch circuit 208 is programmed to select the second clock signal 210 by way of the clock control signal 139. The glitchless clock switch circuit 208 utilizes conventional logic circuits which synchronously switch between the first and second clocks signals 210, 216, thereby providing a glitchless clock switch operation. The clock switch can be operated synchronously because the second clock signal 216 is a synchronous derivative of the first clock signal 210.

To further understand the operation of the oscillator circuit 143, the master PLL 202, the slave PLL 206, and the tracking control circuit 204 are described in greater detail below.

Figure 3:
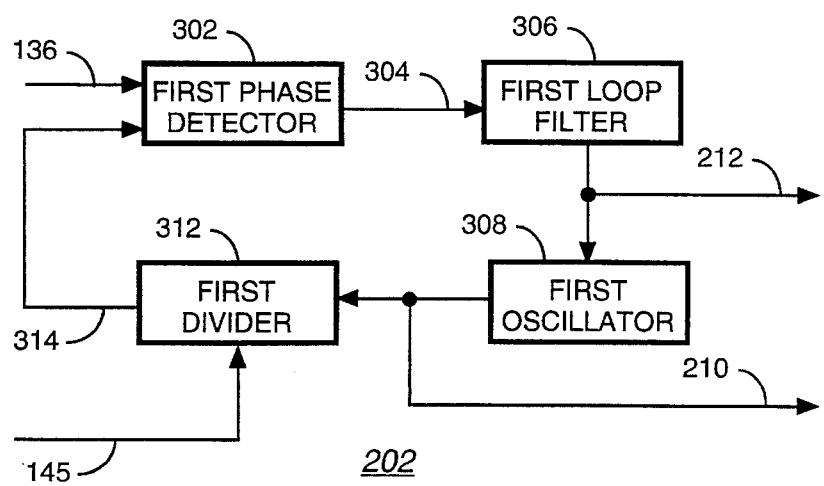
FIG. 3 is an electrical block diagram of the master phased-locked loop (PLL) circuit of the oscillator circuit according to the present invention.

Referring to FIG. 3, the master PLL 202 comprises a first phase detector 302, a first loop filter 306, a first oscillator 308 and a first divider 312.

The first phase detector 302 is a conventional phase detector preferably utilizing a sink-source-float phase detector circuit. The first phase detector 302 measures the phase difference between the first reference frequency signal 136 and a first frequency divided signal 314 generated by the first divider 312. The first phase detector 302 generates a first phase detector output signal 304 that is coupled to the input of the first loop filter 306.

The first loop filter 306 has a transfer function preferably conforming to the combination of a conventional lead-lag network filter and a conventional integrator. The first loop filter 306, in response to the first phase detector output signal 304, generates the oscillator control signal 212 that is coupled to the inputs of the first oscillator 308, and the tracking control circuit 204. The first oscillator 308 is a current controlled oscillator that responds to the oscillator control signal 212 by adjusting the frequency of the first clock signal 210. The first clock signal 210 is coupled to the inputs of the first divider 312, and the glitchless clock switch circuit 208.

The first divider 312 divides the frequency of the first clock signal 210 by a first divide constant thereby generating the first frequency divided signal 314. The first divider 312 utilizes a conventional binary counter for dividing the frequency of the first clock signal 210. It will be appreciated that, alternatively, other conventional counters that provide capability for frequency division can be used. The first divider 312 is preferably programmable, and is coupled to the divide constant programming signal 145 for that purpose. The divide constant programming signal 145 is generated by the system control circuit 137 as a parallel bus that includes a data bus and select signal allowing for the programming of the first divide constant of the first divider 312.

Figure 4:
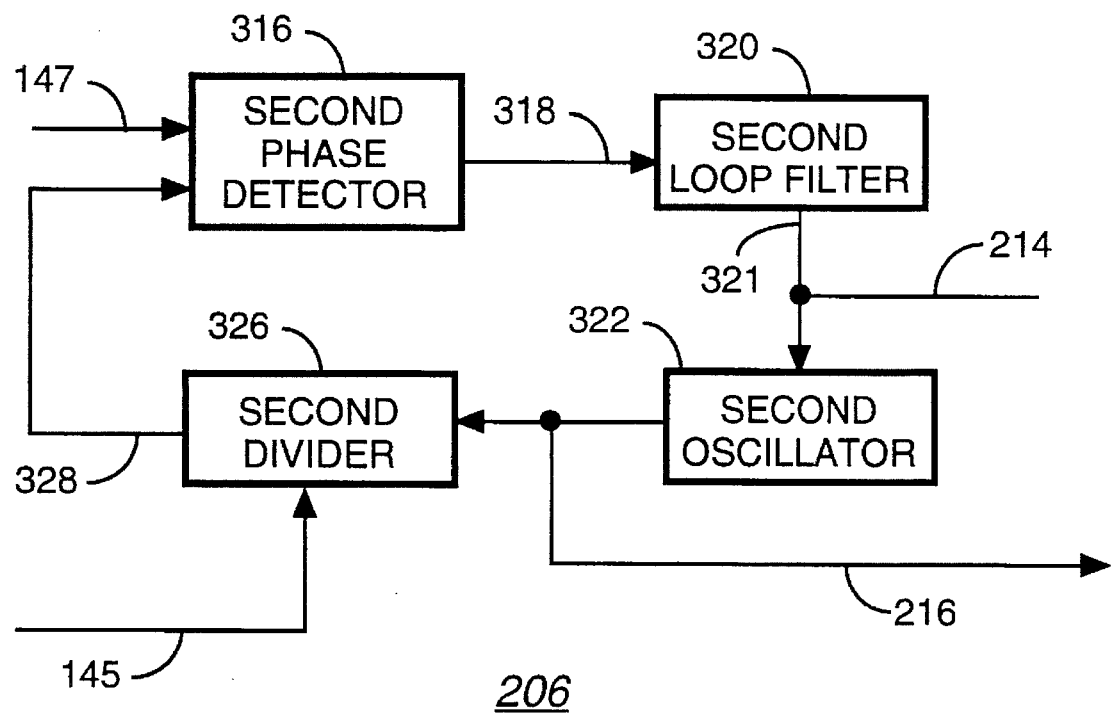
FIG. 4 is an electrical block diagram of the slave PLL circuit of the oscillator circuit according to the present invention.

Turning to FIG. 4, the slave PLL 206 comprises a second phase detector 316, a second loop filter 320, a second oscillator 322 and a second divider 326.

The second phase detector 316 is a conventional phase detector preferably utilizing a sink-source-float phase detector circuit. The second phase detector 316 measures the phase difference between the second reference frequency signal 147 and a second frequency divided signal 328 generated by the second divider 326. In response to making a phase measurement, the second phase detector 316 generates a second phase detector output signal 318 that is coupled to the input of the second loop filter 320.

The second loop filter 320 has a transfer function preferably conforming to the combination of a conventional lead-lag network filter and a conventional integrator. The second loop filter 320, in response to the second phase detector output signal 318, generates a second filtered signal 321. The second filtered signal 321 is a current source signal that is combined with the tracking control signal 214. That is, the currents of these two signals are added together thereby creating a resultant current signal that coupled to the second oscillator 322. The second oscillator 322 is a current controlled oscillator that responds to the resultant current signal by adjusting the frequency of the second clock signal 216. The second clock signal 216 is coupled to the inputs of the second divider 326, and the glitchless clock switch circuit 208. The tracking control signal 214 sets a bias point in the second oscillator 322 that results in a fast coarse warm-up time, or equivalently a fast lock time during power-up.

The second divider 326 divides the frequency of the second clock signal 216 by a second divide constant thereby generating the second frequency divided signal 328. The second divider 326 utilizes a conventional binary counter for dividing the frequency of the second clock signal 216. The second divider 326 is preferably programmable, and is coupled to the divide constant programming signal 145 for that purpose. The divide constant programming signal 145 is generated by the system control circuit 137 as a parallel signal bus that includes a data bus and select signal allowing for the programming of the second divide constant of the second divider 326.

Figure 5:
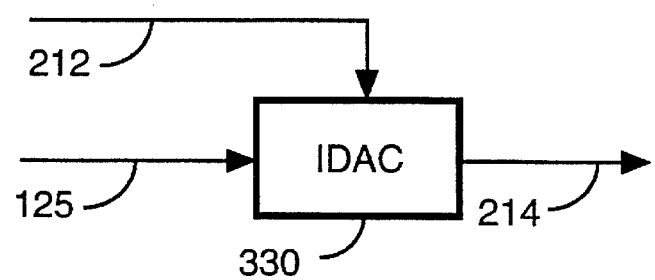
FIG. 5 is an electrical block diagram of the tracking control circuit of the oscillator circuit according to the present invention.

FIG. 5 shows the tracking control circuit 204 in accordance with the present invention. The tracking control circuit 204 comprises a direct-current digital-to-analog converter (IDAC) 330. The IDAC 330 has two inputs comprising the tracking information signal 125 and the oscillator control signal 212. The IDAC 330 generates the tracking control signal 214 that is a direct-current analog signal The oscillator control signal 212 is an analog current reference signal for the IDAC 330. The binary information in the tracking information signal 125 scales the tracking control signal 214 based on multiplication factors of the oscillator control signal 212. For example, a binary signal in the tracking information signal 125 equal to two generates a tracking control signal 214 that is twice the current of the oscillator control signal 212.

The system control circuit 137 determines the appropriate tracking information signal 125 by applying an algorithm that multiplies the oscillator control signal 212 by a ratio of the second divide constant to the first divide constant, and by a ratio of the frequency of the second reference frequency signal 147 to the frequency of the first reference frequency signal 136. In an alternative embodiment, a nonlinear approach can be used for determining the appropriate tracking information signal 125. That is, a nonlinear transfer function can be derived for both the first and second oscillators 308, 322. The transfer function can be characterized discretely and stored in the ROM 142 of the processing system 126. The oscillator control signal 212 can then be applied to the transfer function stored in the ROM 142 to determine an appropriate tracking information signal 125.

Figure 6:
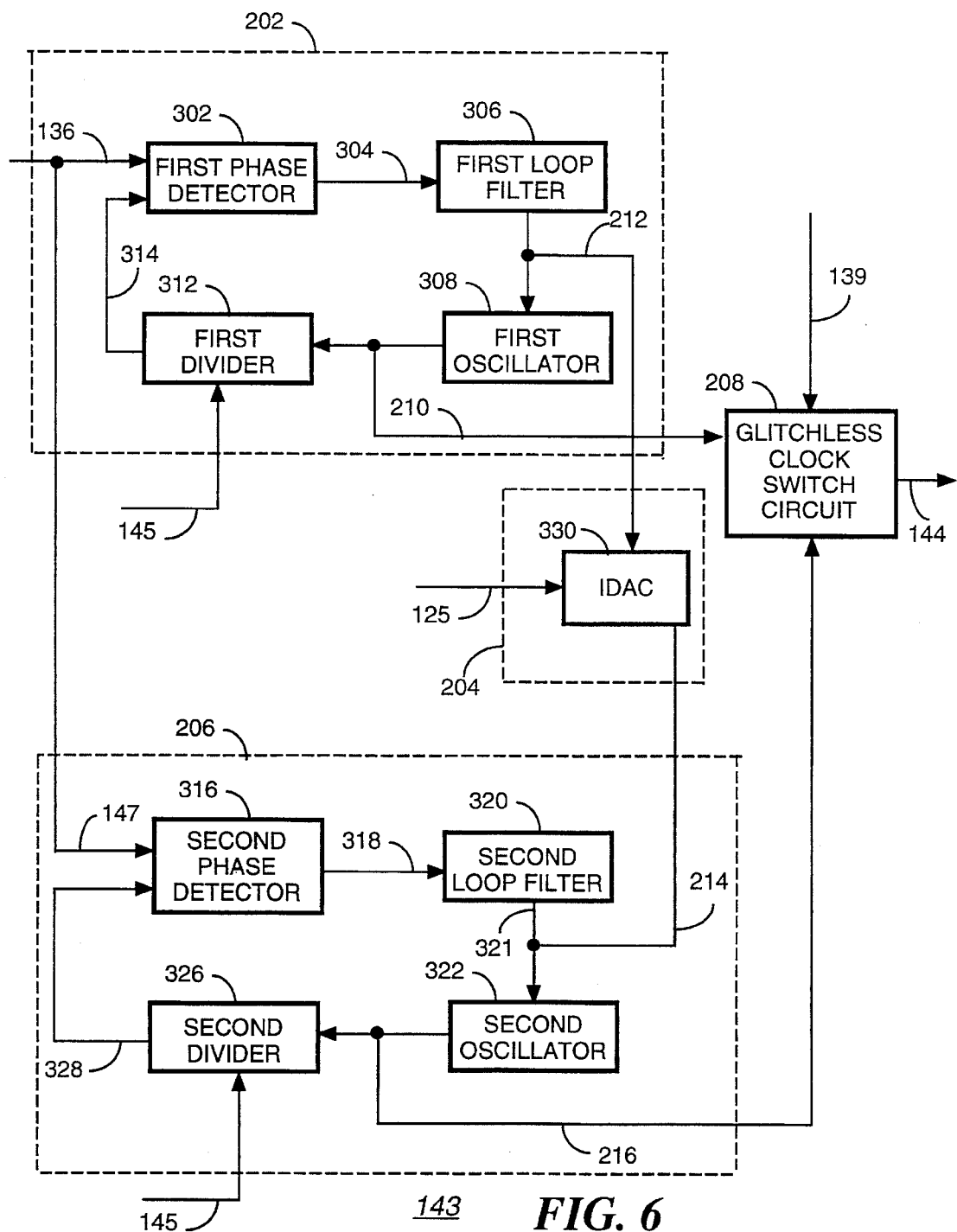
FIG. 6 is an electrical block diagram detailing the implementation of the oscillator circuit according to the present invention.

FIG. 6 is an electrical block diagram comprehensively detailing the implementation of all the elements of the oscillator circuit 143 in accordance with the present invention. Preferably, the oscillator circuit 143 is integrated within a single monolithic device. Integrated circuits within a monolithic device track extremely well. This is important because it provides for the first and second oscillators 308, 322 to have substantially similar electrical characteristics leading to essentially identical oscillators. Thus, the behavior of each oscillator is closely matched resulting in predictable function characteristics in response to a control signal.

The lock time of the slave PLL 206 is also important. The tracking control signal 214 is scaled by the IDAC 330 to bias the second oscillator 322 within a small range of the desired operating frequency. The second oscillator 322 will respond quickly to the tracking control signal 214 because of the predictable relationship between the first and second oscillators 308, 322, thereby effectuating a fast lock time.

Finally, the power consumption of the master PLL 202 also important. When the selective call receiver 100 is in standby it is important that all standby circuits dissipate minimal current. By designing the master PLL 202 to operate at low frequency, a reasonable power consumption can be achieved. Thus, the master PLL 202 preferably operates at the lowest operating frequency, i.e., the frequency of the first reference frequency 136. Experimentation has shown that when the time base reference oscillator 135 operates from a crystal frequency oscillator with a frequency between 32 KHz to 38.4 KHz, the master PLL 202 dissipates less than 10 uA.

Achieving the foregoing provides for a simpler design for the second oscillator 322. This is because traditionally the second oscillator 322 is designed for a wide frequency spectrum to account for a wide frequency range during power up of the phase-locked loop. By providing the tracking signal 214 that is set to a bias point during power up, the second oscillator 322 can be designed for a narrower frequency spectrum, thereby simplifying the circuit.

Thus, it should be apparent that the present invention provides an apparatus for controlled tracking of oscillators in a circuit with multiple frequency sensitive elements. In particular, the invention provides an apparatus that utilizes a low power master-slave phase-locked loop configuration. The master PLL 202 is a simplified phase-locked loop that is low in power consumption, and provides a bias signal for a slave PLL 206. Consequently, the bias signal allows the second oscillator 322 of the slave PLL 206 to be designed with a narrower frequency spectrum, thereby simplifying the circuit, and lowering cost.

What is claimed is:

1. An oscillator circuit comprising:
   a master phase-locked loop (PLL) circuit responsive to a first reference frequency signal, the master PLL circuit comprising:
      a first oscillator having an input responsive to an oscillator control signal for generating as output a first clock signal;

a first divider having an input coupled to an output of the first oscillator for dividing a frequency of the first clock signal by a first divide constant and generating as output a first frequency divided signal;

a first phase detector receiving as input the first reference frequency signal and the first frequency divided signal and generating a first phase detector output signal;

a first loop filter coupled to an output of the first phase detector for filtering the first phase detector output signal and for generating as output the oscillator control signal that is coupled to an input of the first oscillator;

a slave PLL circuit responsive to a second reference frequency signal, the slave PLL circuit comprising:

a second oscillator that is substantially identical to the first oscillator and having an input responsive to a tracking control signal for generating as output a second clock signal;

a second divider having an input coupled to an output of the second oscillator for dividing a frequency of the second clock signal by a second divide constant and generating as output a second frequency divided signal;

a second phase detector receiving as input the second reference frequency signal and the second frequency divided signal and generating a second phase detector output signal;

a second loop filter coupled to an output of the second phase detector for filtering the second phase detector output signal and for generating as output a second filtered signal that is coupled to an input of the second oscillator; and a tracking control circuit coupled to the master PLL circuit and the slave PLL circuit to receive as input the oscillator control signal, and a tracking information signal, to generate the tracking control signal based thereon.

2. The oscillator circuit of claim 1, wherein the tracking information signal includes tracking information determined by multiplying the oscillator control signal by a ratio of the second divide constant to the first divide constant and by a ratio of a frequency of the second reference frequency signal to a frequency of the first reference frequency signal.

3. The oscillator circuit of claim 1, wherein the first oscillator and the second oscillator are current controlled oscillators, and wherein the oscillator control signal and the tracking control signal are current signals.

4. A processor system, comprising an oscillator circuit comprising:

a master phase-locked loop (PLL) circuit responsive to a first reference frequency signal, the master PLL circuit comprising:

a first oscillator having an input responsive to an oscillator control signal for generating as output a first clock signal;

a first divider having an input coupled to an output of the first oscillator for dividing a frequency of the first clock signal by a first divide constant and generating as output a first frequency divided signal;

a first phase detector receiving as input the first reference frequency signal and the first frequency divided signal and generating a first phase detector output signal;

a first loop filter coupled to an output of the first phase detector for filtering the first phase detector output signal and for generating as output the oscillator control signal that is coupled to an input of the first oscillator;

a slave PLL circuit responsive to a second reference frequency signal, the slave PLL circuit comprising:

a second oscillator that is substantially identical to the first oscillator and having an input responsive to a tracking control signal for generating as output a second clock signal;

a second divider having an input coupled to an output of the second oscillator for dividing a frequency of the second clock signal by a second divide constant and generating as output a second frequency divided signal;

a second phase detector receiving as input the second reference frequency signal and the second frequency divided signal and generating a second phase detector output signal;

a second loop filter coupled to an output of the second phase detector for filtering the second phase detector output signal and for generating as output a second filtered signal that is coupled to an input of the second oscillator; and a tracking control circuit coupled to the master PLL circuit and the slave PLL circuit to receive as input the oscillator control signal, and a tracking information signal to generate the tracking control signal based thereon.

5. The processor system of claim 4, and further comprising a system control circuit coupled to the tracking control circuit and coupled to the slave PLL circuit for receiving the second clock signal therefrom, the system control circuit for generating the tracking information signal by multiplying the oscillator control signal by a ratio of the second divide constant to the first divide constant and by a ratio of a frequency of the second reference frequency signal to a frequency of the first reference frequency signal.

6. The processor system of claim 5, wherein the system control circuit generates an ON/OFF control signal that is coupled to the slave PLL circuit for enabling and disabling the slave PLL circuit.

7. A selective call receiver, comprising a processor system having an oscillator circuit comprising:

a master phase-locked loop (PLL) circuit responsive to a first reference frequency signal, the master PLL circuit comprising:

a first oscillator having an input responsive to an oscillator control signal for generating as output a first clock signal;

a first divider having an input coupled to an output of the first oscillator for dividing a frequency of the first clock signal by a first divide constant and generating as output a first frequency divided signal;

a first phase detector receiving as input the first reference frequency signal and the first frequency divided signal and generating a first phase detector output signal;

a first loop filter coupled to an output of the first phase detector for filtering the first phase detector output signal and for generating as output the oscillator control signal that is coupled to an input of the first oscillator;

a slave PLL circuit responsive to a second reference frequency signal, the slave PLL circuit comprising:

a second oscillator that is substantially identical to the first oscillator and having an input responsive to a tracking control signal for generating as output a second clock signal;

a second divider having an input coupled to an output of the second oscillator for dividing a frequency of the second clock signal by a second divide constant and generating as output a second frequency divided signal;

a second phase detector receiving as input the second reference frequency signal and the second frequency divided signal and generating a second phase detector output signal;

a second loop filter coupled to an output of the second phase detector for filtering the second phase detector output signal and for generating as output a second filtered signal that is coupled to an input of the second oscillator; and a tracking control circuit coupled to the master PLL circuit and the slave PLL circuit to receive as input the oscillator control signal, and a tracking information signal to generate the tracking control signal based thereon.

8. The selective call receiver of claim 7, wherein the processor system further comprises a system control circuit coupled to the tracking control circuit and coupled to the slave PLL circuit for receiving the second clock signal therefrom, the system control circuit for generating the tracking information signal by multiplying the oscillator control signal by a ratio of the second divide constant to the first divide constant and by a ratio of a frequency of the second reference frequency signal to a frequency of the first reference frequency signal.

9. The selective call receiver of claim 8, wherein the system control circuit generates an ON/OFF control signal that is coupled to the slave PLL circuit for enabling and disabling the slave PLL circuit.

\* \* \* \* \*